United States Patent
Talbot et al.

(10) Patent No.: US 6,865,682 B1
(45) Date of Patent: Mar. 8, 2005

(54) MICROPROCESSOR MODULE WITH INTEGRATED VOLTAGE REGULATORS

(75) Inventors: Gerald Talbot, Concord, MA (US); Hanwoo Cho, Concord, MA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/335,940

(22) Filed: Jun. 18, 1999

(51) Int. Cl.[7] ........................... G06F 1/26; G06F 13/00; G05F 1/02
(52) U.S. Cl. .................... 713/300; 710/301; 323/271; 323/282
(58) Field of Search ................ 713/300–340; 710/300–304; 323/265–290, 349–351

(56) References Cited

U.S. PATENT DOCUMENTS

| | | | | |
|---|---|---|---|---|
| 4,965,492 A | * | 10/1990 | Boldwyn ..................... | 315/156 |
| 5,532,524 A | * | 7/1996 | Townsley et al. ............. | 307/64 |
| 5,556,811 A | * | 9/1996 | Agatstein et al. ........... | 438/106 |
| 5,721,485 A | * | 2/1998 | Hsu et al. .................... | 323/901 |
| 5,757,171 A | * | 5/1998 | Babcock ..................... | 323/271 |
| 5,774,734 A | * | 6/1998 | Kikinis et al. .............. | 713/300 |
| 5,838,929 A | * | 11/1998 | Tanikawa ................... | 710/302 |
| 5,847,951 A | * | 12/1998 | Brown et al. ............... | 363/147 |
| 5,864,225 A | * | 1/1999 | Bryson ....................... | 323/268 |
| 5,918,023 A | * | 6/1999 | Reeves et al. .............. | 710/102 |
| 5,945,820 A | * | 8/1999 | Namgoong et al. ......... | 323/282 |
| 6,023,148 A | * | 2/2000 | Pignolet ..................... | 320/119 |
| 6,035,358 A | * | 3/2000 | Tanikawa ................... | 710/310 |
| 6,041,372 A | * | 3/2000 | Hart et al. .................... | 710/62 |
| 6,191,499 B1 | * | 2/2001 | Severson et al. ............. | 307/31 |
| 6,282,596 B1 | * | 8/2001 | Bealkowski et al. ........ | 710/103 |
| 6,310,792 B1 | * | 10/2001 | Drobnik ..................... | 363/147 |
| 6,594,556 B1 | * | 7/2003 | Agatstein et al. ........... | 700/298 |
| 2001/0033152 A1 | * | 10/2001 | Pohlman et al. ............ | 323/269 |

* cited by examiner

*Primary Examiner*—Sumati Lefkowitz
(74) *Attorney, Agent, or Firm*—Mills & Onello LLP

(57) ABSTRACT

In a microprocessor module assembly, voltage regulators are integrated into the module and adapted for use with a processor and support electronics likewise mounted on the module. The voltage regulators receive a fixed imput voltage from a motherboard interface and provide modified regulated output voltages to the processor and support electronics. In this manner, the processor module is readily upgradable such that future generations are compatible with a fixed motherboard interface without the need for upgrading voltage regulators on the motherboard. In a preferred embodiment, bulk decoupling capacitance is provided on the processor assembly to stabilize the DC output voltage of the voltage regulators.

9 Claims, 3 Drawing Sheets

MICROPROCESSOR MODULE WITH INTEGRATED VOLTAGE REGULATORS

BACKGROUND OF THE INVENTION

Microprocessor modules have become popular in recent years as a means for providing reliable and efficient computer system upgrades. In a microprocessor module, a processor is mounted to a circuit panel containing electrical interconnection paths, for example a printed circuit board, along with support electronics, for example random access memory (RAM) in the form of processor cache. Module electronics communicate with electronics mounted to a computer motherboard via an interface in the form of a high-speed connector. Ideally, as system clock rates increase, and processor functions evolve, the outdated microprocessor module assembly can be removed from the motherboard at its connector and replaced by an upgraded module capable of operating at the higher rate, and/or with improved functionality.

A straightforward processor module replacement is not necessarily achieved by contemporary systems. As processors become faster, the underlying silicon gate technology becomes smaller, and therefore requires a different, for example, an increasingly lower, supply voltage level. The lower voltage level required by the upgrade processor module is thus exceeded by the voltage supplied by the original voltage regulators commonly mounted directly to the motherboard designed specifically for use with the former processor module. For this reason, the upgrade processor module may be incompatible with the existing motherboard. Therefore, processor module upgrade currently involves not only replacement of the module at the module connector, but also removal and reinsertion of, or reprogramming of, voltage regulators mounted to the motherboard.

This is complicated by the fact that often times, within the module itself, the processor utilizes a different supply voltage than that of the support electronics, for example cache RAM, the multiple supply voltages being generated by the multiple voltage regulators mounted to the motherboard. Module replacement in this case therefore requires the additional replacement of the multiple voltage regulators on the motherboard.

Additionally, as processor module supply voltages decrease, and clock rates increase, processor module power consumption generally remains constant, and, as a result, the current draw for the module increases. Since modem processor modules have current draws on the order of 50–70 Amperes, sophisticated connectors are required to mitigate what otherwise would be significant voltage drops at the module connector due to inherent resistance and inductance at the connector terminals. Such specialized connectors are expensive and bulky, and are therefore undesirable in modular computer systems.

SUMMARY OF THE INVENTION

The present invention is directed to a processor module assembly and motherboard interface that addresses and overcomes the power supply limitations of conventional systems. Voltage regulators integrated directly on the processor module are adapted specifically for use with the module processor and module support electronics. The voltage regulators receive external fixed voltages via a motherboard interface, for example a connector, and supply the appropriate voltages for driving the processor and support electronics. In this manner, the processor module is readily upgradable and can be replaced in a simplified module-swap procedure, without the need for adjusting or replacing power supply electronics on the motherboard.

The processor module of the present invention includes a circuit panel, a processor, support electronics, a voltage regulator, and an interface. The processor, support electronics, and voltage regulator are collectively mounted to the circuit panel and are in electronic communication. A voltage regulator receives an input voltage from a voltage source and provides a regulated output voltage to the support electronics and the microprocessor. An interface removably couples the circuit panel to a motherboard. The interface provides the input voltage to the voltage regulator, the input voltage being provided by the motherboard at a fixed voltage level.

In a preferred embodiment, the support electronics comprise cache random access memory (RAM). The interface preferably further provides a system bus interface suitable for electronic communications, for example data bus, address bus, and control communications between the microprocessor and the motherboard. The regulated output voltage is preferably selectable over a range of voltages.

The voltage regulator preferably comprises first and second voltage regulators. The first voltage regulator provides a first regulated output voltage to the support electronics. The second voltage regulator provides a second regulated output voltage to the processor. In an embodiment where the support electronics comprise cache RAM, the first voltage regulator comprises a linear voltage regulator and the second voltage regulator comprises a switching regulator. A decoupling capacitance is preferably included on the module for decoupling high frequency components of the current-time variance in the input voltage. In the case where the voltage regulator comprises a switching regulator, the switching regulator preferably includes a planar inductor integrated on the circuit panel. The microprocessor may comprise multiple processing units.

In this manner, the present invention provides a readily upgradable and replaceable microprocessor module assembly that is consistent with a fixed motherboard interface, and provides suitable source voltages to a processor and support electronics on the processor module having source voltage requirements that vary from generation to generation.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
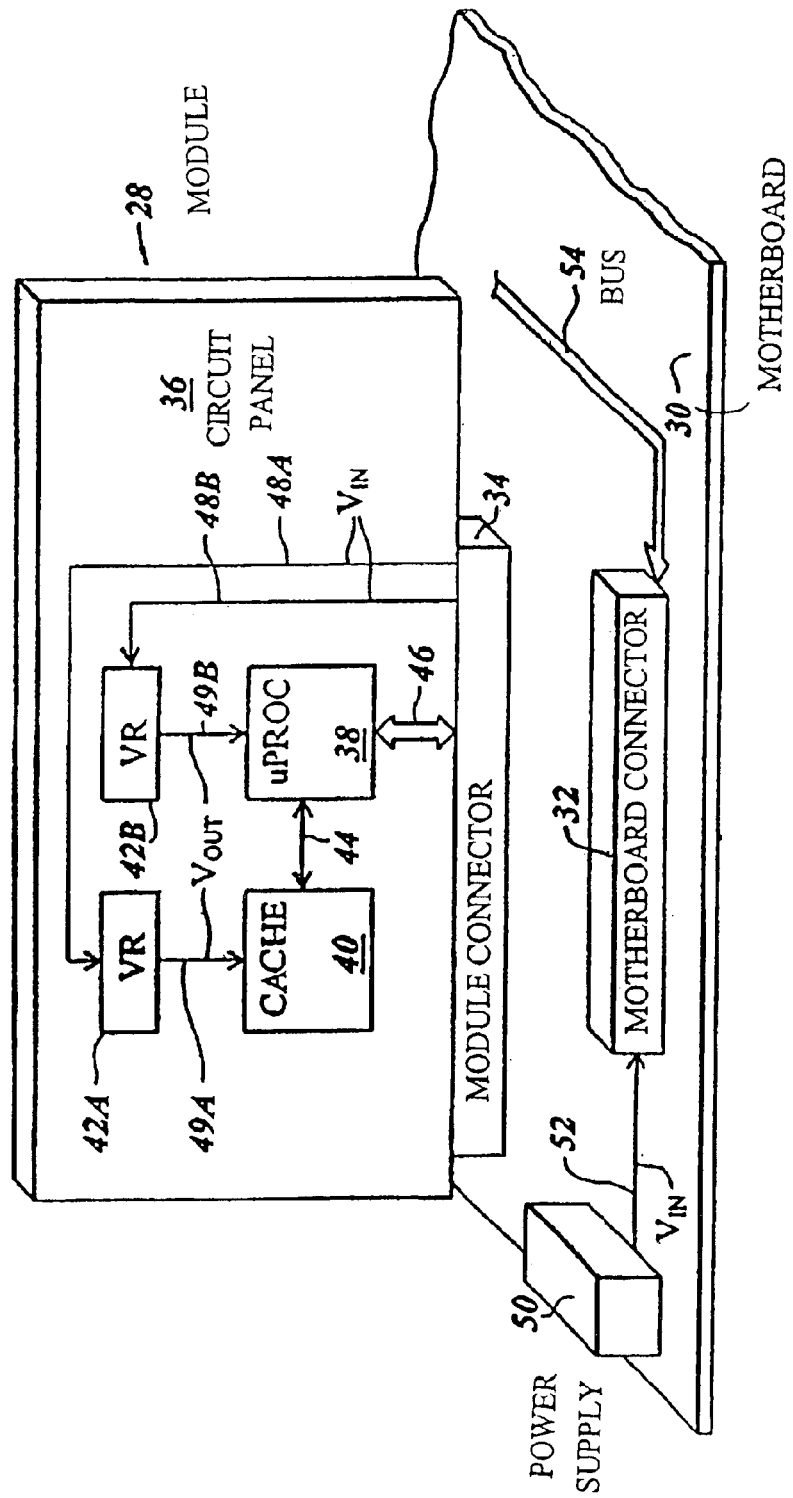
FIG. 1 is a perspective view of a microprocessor module assembly including integrated voltage regulators in accordance with the present invention.

FIG. 1 is a perspective view of a microprocessor module assembly including integrated voltage regulators in accordance with a preferred embodiment of the present invention. The microprocessor module 28 includes a circuit panel 36, upon which a processor 38, support electronics, for example cache random access memory (RAM) 40, and first and second voltage regulators 42A, 42B respectively, are mounted, and electronically interconnected, according to standard processor architecture practices. The circuit panel may comprise, for example, a multiple-layer circuit panel have standard interconnects for electronically coupling the components mounted thereto.

The processor module 28 further includes an interface in the form of a connector 34 adapted to communicate with a corresponding mating connector 32 mounted on a motherboard 30. The motherboard includes electronics coupled to the motherboard connector 32 via an interconnect bus 54, including data, address and control signals operating according to standard bus protocols compatible with the communication bus protocol of processor 38 on the processor module 28.

The motherboard 30 further includes a power supply 50 for supplying power to components mounted to the motherboard 30, including processor module 28. Power is supplied to the processor module 28 in the form of an input voltage Vin 52, generated by the power supply 50, and transferred to the module 28 via connectors 32, 34. In a preferred embodiment, the input voltage 52 is a voltage that remains fixed on the motherboard, for example, in the range of 5–12 volts DC, such that supply voltage adjustments need not be made to the motherboard when mounting an upgraded processor module thereto.

The fixed input voltage Vin 52 is supplied to the processor module 28 through the connectors 32, 34 and power supply lines 48A, 48B to first and second voltage regulators 42A, 42B, which, in turn, supply a regulated output voltage Vout on lines 49A, 49B to components, for example processor 38 and cache-RAM 40, on the processor module 28. Components on the module 28 may have different power requirements, and therefore the fixed input voltage Vin may comprise first and second input voltages at different voltage levels transferred from the motherboard power supply 50 to the module 28 through the connectors 32, 34 via multiple first and second input voltage supply lines 48A, 48B. The first and second fixed input voltages on lines 48A, 48B are modified to first and second regulated output voltages Vout 49A, 49B by the first and second voltage regulators 42A, 42B respectively. The regulated output voltages Vout, in turn, supply the support electronics 40, and processor 38 with power.

In a preferred embodiment, the voltage regulators 42A, 42B receive a similar fixed input voltage level via voltage lines 48A, 48B. However, the motherboard 30 may be configured at its power source 50 to provide multiple input voltages at multiple levels, and therefore, in a preferred embodiment, the input voltages may be independent as described above. Similarly, the cache RAM 40 and the microprocessor 38 may have different voltage requirements and therefore, the regulated output voltages 49A, 49B of the voltage regulators 42A, 42B respectively, are preferably at different voltage levels. However, in an alternative embodiment, the first and second voltage regulators 42A, 42B may be incorporated as a single voltage regulator, supplying a single regulated output voltage to module components, for those applications where the processor 38 and the cache-RAM 40 operate at the same power supply voltage levels. In this case, the fixed input voltage Vin may be provided via a single input voltage line 48.

As explained above, the processor module of the present invention, and its interface with the motherboard, are configured for a full and simple upgrade, in a manner that is fully supportive of next-generation hardware having modified power requirements. As described above, as microprocessors become increasingly more sophisticated and therefore have an ever-higher gate count, and as they continue to operate at higher clock rates, the underlying silicon technology continually evolves to require a lower source voltage level. The present invention addresses this issue by setting a fixed voltage level Vin at the motherboard 30, that is provided to the module via the connector 32. The module-mounted voltage regulators locally regulate the supply voltage Vout for components on the module 28. In this manner, the module interface and the provided input voltage 52 remain constant over the lifetime of the computer system, while allowing for simple upgrades to the computer processor and corresponding modifications to the integrated voltage regulators, as needed.

As an example, the Alpha™ processor family has become popular in recent years. Current versions of the Alpha™ processor operate with a 2.2 volt source voltage at a 500 MHz clock rate. The underlying technology is a 0.35 micron channel-width aluminum process. The resulting processor requires 100 watts of power and draws 45 amperes of source current. It is conceivable that in the near future, next-generation Alpha™ processors will be operating at a 1.2 volt source voltage, and at a 1.5 GHz clock rate, utilizing a 0.13 micron silicon-on-insulator (SOI) copper process. This future processor is likely to operate at 60 watts and will draw 66 amperes of current. With this in mind, the present invention provides a platform for upgrading the processor as it becomes smaller, faster, and more sophisticated, while utilizing the same input voltage, and therefore maintaining a constant motherboard platform. The present invention therefore would permit a simple replacement of the processor module cartridge for upgrade to the higher-rate Alpha™ processor.

Just as the power requirements and current draw may change from generation to generation for both the processor and cache RAM, the power requirements and current draw for the cache RAM and processor 38 mounted on the same microprocessor assembly 28 may also be different. For example, a cache RAM may consume 20 Watts of power, while a processor may consume 100 Watts of power. For this reason, multiple voltage regulators 42A, 42B of varying power output capabilities may be employed.

Furthermore, voltage regulator designs come in a number of configurations. As an example, a linear voltage regulator 42A may be appropriate for use with the relatively low power cache RAM 40, while a switching regulator 42B may be appropriate for use with the higher-power processor 38. Both linear regulators and switching regulators are well understood in the art of voltage regulator design.

Figure 2:
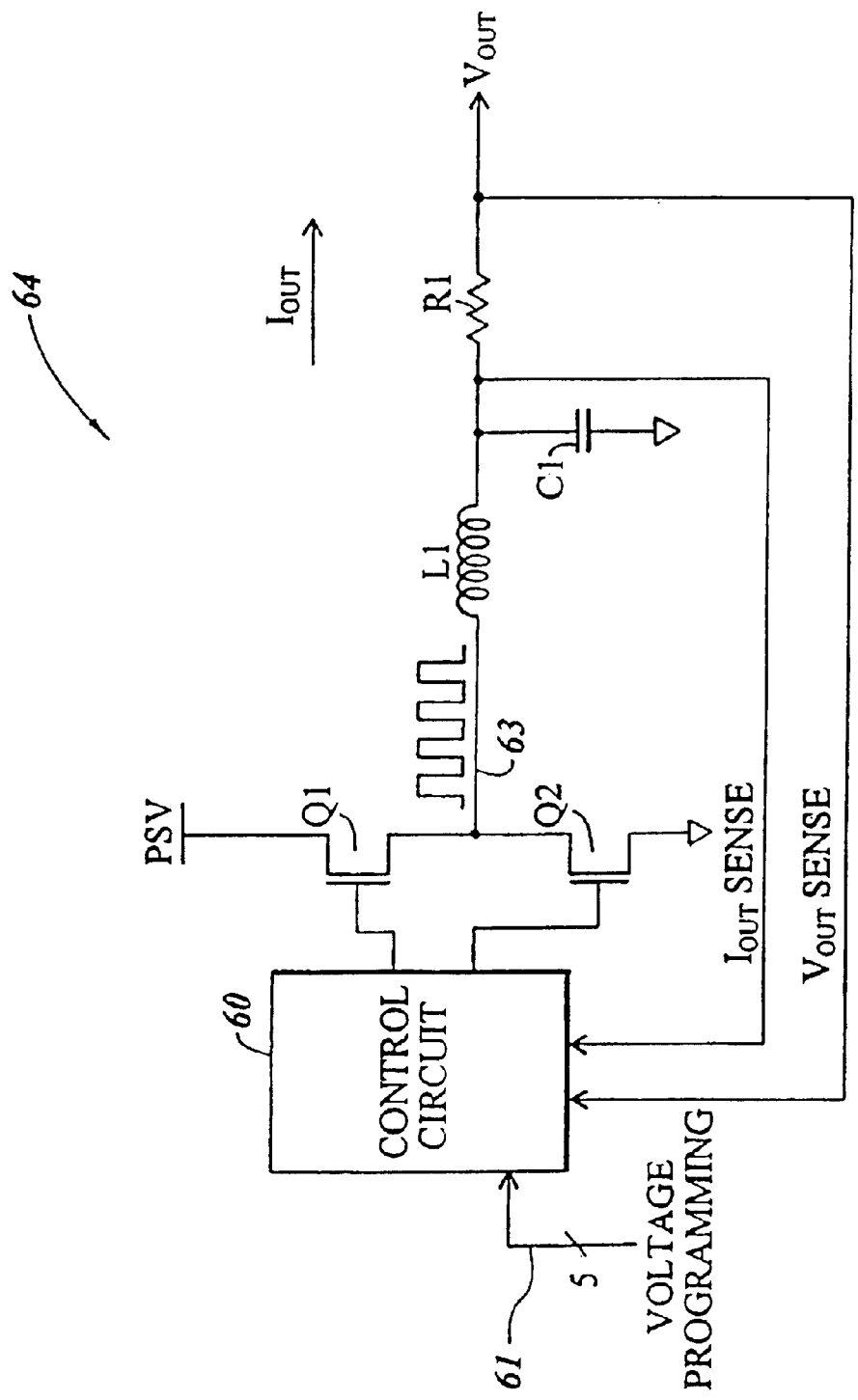
FIG. 2 is a schematic block diagram of a switching voltage regulator in accordance with the present invention.

Switching regulators are popular in electronic applications. FIG. 2 is a schematic block diagram for a switching regulator 64 in accordance with the present invention. This switching regulator 64 may be employed as one or both of the voltage regulators 42A, 42B of FIG. 1. In this embodiment, a control circuit 60 alternately activates transistors Q1 and Q2, connected in series between a power supply voltage, for example the Vin voltage provided by voltage lines 48A, 48B of FIG. 1, and ground. The alternate activation of Q1 and Q2 results in a square wave at node 63 that is provided to the input of inductor L1 which, in combination with capacitor C1, generates a DC voltage Vout. The inductor L1 may comprise, for example, a planar inductor, in the form of a hole filled with ferrite integrated into the circuit panel 36 in accordance with conventional planar inductor techniques. Other means for generating the planar inductor L1 are possible, and applicable to the present invention.

During operation, the output current Iout is sensed and fed back to the control circuit 60 via sensing line Iout-sense, for example, by utilizing current sensing resistor R1, while the output voltage Vout is sensed and fed back to control circuit 60 via sensing line Vout-sense. The control circuit 60 further receives a digital command signal via line 61 in the form of a voltage programming code, for example as provided by an initialization code ROM or other hard-wired configuration to cause an appropriate binary control word to be produced, to indicate a suitable Vout to be generated by the voltage regulator 64 in accordance with conventional voltage regulator techniques.

Figure 3:
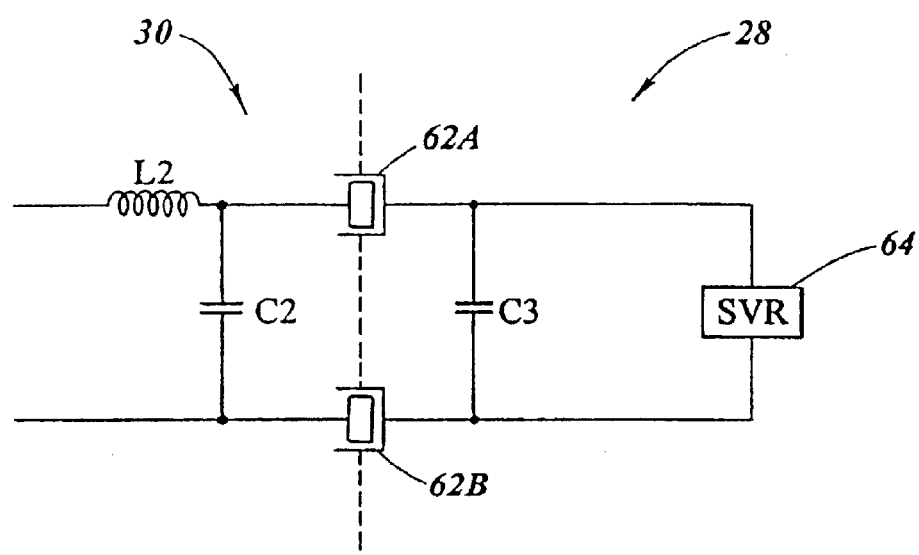
FIG. 3 is a schematic block diagram of a microprocessor module assembly having integrated coupling capacitance in accordance with the present invention.

A problem exists in this switching regulator configuration in that when the control circuit 60 alternately activates transistors Q1 and Q2, very large current pulses flow into transistor Q1 upon its activation. This, in turn, introduces a modulation into the output voltage Vout. To alleviate this problem, a preferred embodiment of the present invention employs an integrated bulk decoupling capacitance C3 on the processor assembly 28 as shown in FIG. 3.

The decoupling capacitance C3 is preferably disposed between the power supply and return path on the module, in parallel with the switching voltage regulator 64. In FIG. 3, portion 30 to the left of the dashed line, represents the effective inductance and capacitance L2, C2, respectively, of components mounted to the motherboard 30. Interface connectors 62A, 62B represent, for example, male and female electrical contacts of connectors 32, 34, and provide a pathway for power to be input to the processor module 28, shown on the right side of the dashed line.

The connector terminals 62A, 62B include an inherent DC resistance and inductance. Due to the very high magnitude of dI/dt, that is, the high rate of change (d/dt) of the current (I) into the switching voltage regulator 64, the inductance of the connector 62A, 62B becomes significant, and manifests itself in the form of a large voltage drop at the connector. The bulk decoupling capacitance C3 further serves to reduce the extent of this voltage drop, causing the high-frequency components of the current waveform to flow primarily on the processor module 28, while causing the low-frequency components of the current waveform to return through the connector to flow through the motherboard 30 effective capacitance C2. In this manner, a majority of the desired current powers the switching voltage regulator 64, while a minority of the current, that is, the undesired portion, returns through the motherboard.

In a preferred embodiment, the decoupling capacitance C3 is physically very large and is distributed such that approximately 60%–80% of the total combined capacitance C2+C3 is provided by the motherboard capacitor C2, while approximately 20%–40% of the total capacitance is provided by the bulk decoupling capacitor C3 on the processor module 28. The motherboard capacitance value C2 is selected to be consistent for use over the full foreseeable operating range of the switching voltage regulator 64 over the lifetime of the system. Other C2/C3 ratios may be preferable, depending on the application.

A preferred embodiment of the present invention further allows the designer of the motherboard 30 to select a range of fixed supply voltages, for example, in the range of 5–12 volts. In this manner, the designer can employ commodity power supplies 50 (see FIG. 1), available at a much lower cost than custom power supplies, to power the processor module 28. For this reason, the present invention includes an adaptive control circuit 60 (see FIG. 2) that senses the output voltage Vout via an output voltage sensing signal Vout-sense, which, in combination with appropriately chosen devices for components C3, L1, Q1, and Q2, allows for the operating range to be extended such that the processor module is operable between the range of provided voltages, for example, 5–12 volts.

While this invention has been particularly shown and described with reference to preferred embodiments thereof, it will be understood by those skilled in the art that various changes in form and in detail may be made therein without departing from the spirit and scope of the invention as defined by the appended claims.

For example, the processor 38 may comprise a current, or future generation processor, for example an Alpha™ processor produced by Compaq Computer Corp., or x86™ processor produced by Intel Corp. Although shown and described above as a single processor, the processor 38 may comprise a multiple processor architecture, for example a parallel processing system. The processor 38 may further comprise specialized processors, for example digital signal processor (DSP) units.

We claim:

1. A processor module comprising:
    a circuit panel;
    a processor mounted to said circuit panel;
    support electronics for said processor mounted to said circuit panel in electronic communication with said processor;
    a voltage regulator mounted to said circuit panel in electronic communication with said processor and said support electronics, said voltage regulator for receiving an input voltage from a remote voltage source, for modifying the input voltage at the voltage regulator to generate a regulated output voltage, and for providing the regulated output voltage to said support electronics and said processor said voltage regulator comprising a switching voltage regulator that includes a feedback path for sensing at least one of a voltage level and current level of the regulated output voltage;
    an interface for removably coupling said circuit panel to a motherboard, said input voltage being at a fixed voltage level sourced at said motherboard, converted from an external power supply voltage at said motherboard, and provided to said circuit panel through said interface to said voltage regulator; and
    a decoupling capacitance on the circuit panel in parallel with the voltage regulator for decoupling high-frequency components of current-time variance in the input voltage.

2. The processor module of claim 1 wherein said support electronics comprise random access memory.

3. The processor module of claim 2 wherein said support electronics comprise cache.

4. The processor module of claim 1 wherein said interface further provides a system bus interface adapted for providing communication of data, address and control signals.

5. The processor module of claim 1 wherein said voltage regulator comprises first and second voltage regulators, said first voltage regulator for providing a first regulated output voltage to said support electronics, said second voltage regulator for providing a second regulated output voltage to said processor.

6. The processor module of claim 5 wherein said support electronics comprises cache random access memory, and wherein said first voltage regulator comprise a linear voltage regulator, and wherein said second voltage regulator comprises the switching voltage regulator.

7. The processor module of claim 1 wherein said regulated output voltage is selectable over a range of voltage levels.

8. The processor module of claim 1 wherein the processor comprises multiple processing units.

9. The processor module of claim 1 wherein said switching voltage regulator includes a planar inductor integrated on said circuit panel.

* * * * *